United States Patent [19]

Yamamoto

[11] 3,731,161

[45] May 1, 1973

[54] SEMICONDUCTOR INTEGRATED CIRCUIT

[75] Inventor: Hirohiko Yamamoto, Tokyo, Japan

[73] Assignee: Nippon Electric Company Limited, Tokyo, Japan

[22] Filed: Sept. 3, 1971

[21] Appl. No.: 177,631

[30] Foreign Application Priority Data

Sept. 5, 1970 Japan ................................45/78080

[52] U.S. Cl..........317/235 R, 317/235 G, 317/235 B, 317/235 D, 307/304

[51] Int. Cl............................H01l 19/00, H01l 11/14

[58] Field of Search .......................317/235 G, 235 B, 317/235 D; 307/304

[56] References Cited

UNITED STATES PATENTS

| | | | |
|---|---|---|---|
| 3,395,290 | 7/1968 | Farina | 307/202 |
| 3,403,270 | 9/1968 | Pace | 307/304 |
| 3,502,950 | 3/1970 | Nigh | 317/235 |

OTHER PUBLICATIONS

Fischer et al., IBM Tech. Discl. Bull. Vol. 13, No. 5, October, 1970

*Primary Examiner*—Martin H. Edlow
*Attorney*—Nichol M. Sandoe et al.

[57] ABSTRACT

A semiconductor integrated circuit comprises a plurality of insulated gate type field effect transistors formed in a common semiconductor substrate. One of the transistors receives an input signal from an external circuit. The gate insulator film of the receiving transistor is thicker than the insulator film of the other insulated gate type field effect transistors formed on the common substrate.

3 Claims, 12 Drawing Figures

SEMICONDUCTOR INTEGRATED CIRCUIT

BACKGROUND OF THE INVENTION

This invention relates to semiconductor integrated circuits utilizing field effect transistors of the insulated gate type.

In the conventional integrated circuit utilizing insulated gate field effect transistors (hereinafter referred to as "a transistor"), the electrical characteristic of the integrated circuit is appreciably affected by the level of the threshold voltage of the transistor. For example, in a digital logic circuit, if the threshold voltage is low, the switching speed is fast and the amplitude of the output voltage is high, but the logic circuit is caused to operate in error as the result of a low-level input noise voltage. On the contrary, if the threshold voltage is great, the tolerance of the logic circuit to input noise voltage is large, that is, no erroneous operation of the logic circuit results from a high input noise signal, but the switching speed of the circuit is slow and the amplitude of the output voltage is low. It is thus impossible in principle to obtain an integrated circuit that provides both fast switching speed and large amplitude of output voltage. Even when an integrated circuit is fabricated having inferior characteristic to this desired characteristic, the range of the permissible threshold voltage necessary to realize the inferior characteristic is extremely narrow and it is difficult to manufacture reproduceably a transistor which has such a narrow range of threshold voltage. Designers of integrated circuits have primarily directed their efforts to broadening the range of permissible threshold voltage but have thus far been largely unsuccessful in their efforts. In view of this, such designing has been carried out only by a limited number of specialists.

As there is a substantially proportional relationship between the thickness of the gate insulation film and the threshold voltage of the transistor, the use of thick insulation film is not suitable for establishing the threshold voltage at the above range. When a thin insulation film is employed, a large amount of floating static electricity is charged at the input terminal, and there is a high probability that the gate insulation film will be short-circuited and the integrated circuit deteriorated. This short-circuit of the gate insulation films is an inevitable drawback inherent to this kind of integrated circuit.

OBJECT OF THE INVENTION

An object of this invention is to provide a structure of an integrated circuit, which is easy to design and manufacture, and which has great tolerance to input noise voltage, a fast switching speed, and a large amplitude of output voltage.

Another object of this invention is to provide a highly reliable insulation gate type field effect transistor integrated circuit in which the likelihood of a short-circuit of the gate insulation film is practically eliminated.

SUMMARY OF THE INVENTION

The present invention is directed to a semiconductor integrated circuit comprising a plurality of insulated gate type field effect transistors formed in a common semiconductor substrate as circuit elements. At least one of the insulated gate type field effect transistors has a thick gate insulation film and the other insulated gate type field effect transistors all have relatively thin gate insulation films.

In the logic circuit the gate insulation film of an amplifying transistor of the input stage is thick to thereby increase the threshold voltage, whereas the gate insulation film of the amplifying transistor of each intermediate stage and that of a load transistor of the output stage are thin to minimize the threshold voltage. This logic integrated circuit has a great tolerance to input noise voltage, a fast switching speed, and a large amplitude of the output voltage.

Further features and objects of this invention will be understood from the following detailed description relating to several embodiments of this invention referring to the annexed drawings in which:

DETAILED DESCRIPTION OF THE PREFERRED EMBODIMENTS

Figure 1:
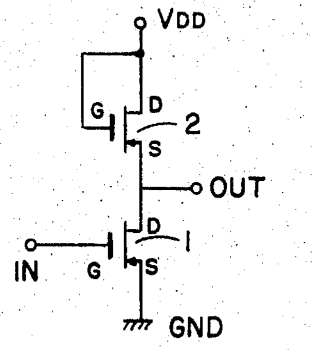
FIG. 1 is an equivalent circuit diagram of an inverter circuit according to a first embodiment of the present invention.

Referring to FIG. 1, an inverter circuit is shown as the first embodiment of the present invention in which an amplifying transistor 1 having a thick gate insulation film is connected in series with a loading transistor 2 having a relatively thin gate insulation film. An input terminal "IN" is connected to the gate electrode G of the transistor 1, and an output terminal "OUT" is connected to a common connection point between the drain "D" of the transistor 1 and the source "S" of the transistor 2. A supply voltage "$V_{DD}$" is connected to the drain D of the transistor 2.

Figure 2:
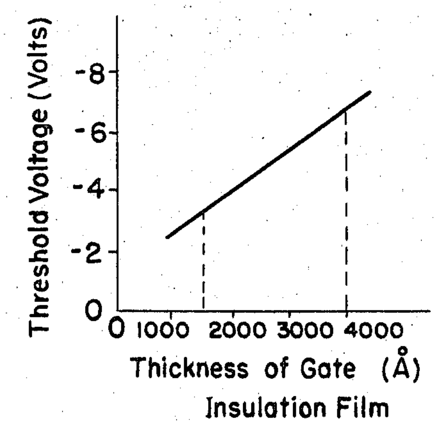
FIG. 2 is a graph showing the relationship between the thickness of a gate insulation film of a transistor and the threshold voltage of that transistor.

The source S of the transistor 1 is grounded as shown by GND. An explanation will be given hereinafter for use of a P-channel insulated gate type field effect transistor which is of the more common type as a transistor, but an N-channel insulated gate type field effect transistor may also be used. FIG. 2 graphically shows the relation between the threshold voltage plotted along the ordinate, and the thickness of the gate insulation film, plotted along abscissa. As illustrated in FIG. 2, in general, there is a substantially proportional relationship between the thickness of the gate insulation film and the threshold voltage. The threshold voltage is large, for example, −6.8V, for a thick gate insulation film, such as of 4,000 A, whereas the threshold voltage is small, for example, −3.2V, for a thin gate insulation film, such as of 1,500 A. In a case as in the circuit of FIG. 1, the amplifying transistor circuit of FIG. 1, the amplifying transistor 1 comprises a gate insulation film of 4,000 A in thickness, a channel width $W_1$ of 150 microns, and a channel length L of 12.5 microns, and that the loading transistor 2 comprises a gate insulation film of 1,500 A in thickness, a channel width W of 5 microns, and a channel length L of 75 microns, the input voltage vs. output voltage characteristic of the inverter circuit is one as shown by a solid line 3 in FIG. 3 when the supply voltage $V_{DD}$ is −24V. Namely, with a change of the input voltage from 0 to −7 V, the output voltage can be maintained at a constant voltage of −17V.

In the conventional integrated circuit, however, all insulated gate type field effect transistors have respective gate insulation films which are same in thickness. If thin gate insulation films, (for example 1,500 A) are used for all transistors, the input-output characteristics of the inverter circuit is one as indicated by the third broken line (4) in FIG. 3. In this case, however, the range of input voltage which maintains the output voltage at −17V is narrow such as 0 – 3V so that the tolerance to input noise is low.

Figure 3:
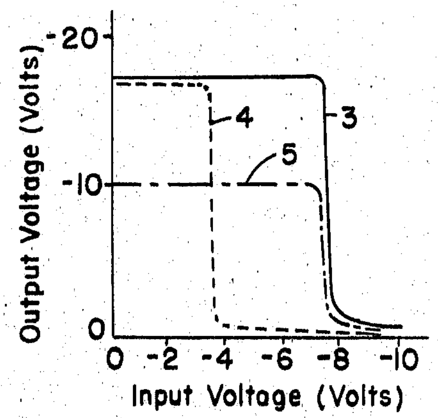
FIG. 3 is a graph showing the relationship between input voltage and output voltage of the circuit shown in FIG. 1.

If thick gate insulation films (for example 4,000A) are used for all transistors, the input-output characteristic of the inverter circuit is one as indicated by a chain line (5) in FIG. 3. In this case, however, the input voltage which maintains the output constant is wide, such as 0 – 7V, and the tolerance to input noise is high. But it should be noted that the output voltage is reduced to −10V. It is, thus, impossible in the prior art to provide a circuit having large noise tolerance voltage with a large output voltage. According to this invention, a circuit having a large noise tolerance voltage with a large output voltage can be realized.

Figure 4:
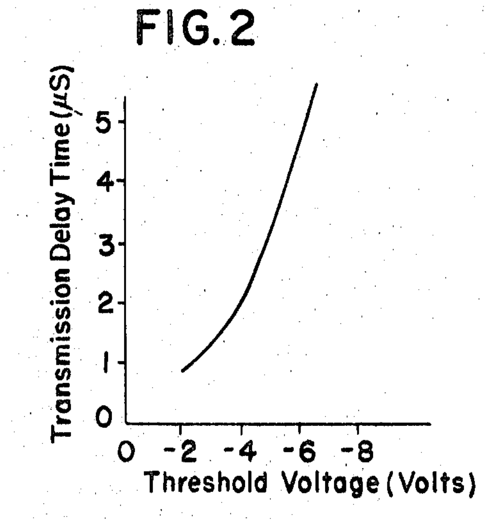
FIG. 4 is a graph showing the relationship between the threshold voltage of the transistor and transmission delaying time.

Referring to FIG. 4, there is shown graphically an example of the general relationship between transmission delay time illustrating the switching speed in a conventional logic circuit type integrated circuit and the threshold voltage of the transistor. As seen from FIG. 4, the smaller the threshold voltage, namely the thinner the thickness of the gate insulation film, the faster is the switching speed, while the greater the threshold voltage, namely the thicker the thickness of the gate insulation film, the slower is the switching speed. If the threshold voltage is selected to be large, that is, if the thickness of the gate insulation film is selected to be thick in order to realize a high tolerance to input noise, it will be understood from FIG. 4 that drawbacks result in that the amplitude of output voltage is small and the switching speed is slow.

According to the present invention, the resistance of MOS transistor 2 in FIG. 1 is selected to be larger than that of MOS transistor 1 and it is therefore possible to reduce the threshold voltage of the loading transistor 2 which determines the switching speed, or to reduce the thickness of the gate insulation film of that transistor, while the threshold voltage of the amplifying transistor 1 to which the input signal is supplied, or the thickness of its gate insulation film is great. As a result, an integrated circuit is obtained in which tolerance to input noise voltage is large and switching speed is fast.

Figure 5:
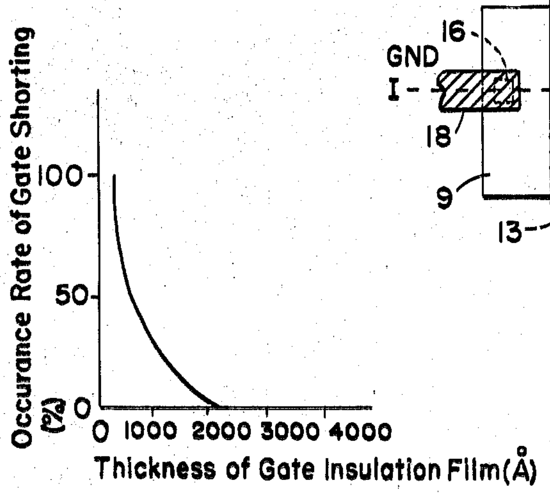
FIG. 5 is a graph showing the relationship between the thickness of a gate insulation film of a transistor and the rate of occurrence of gate shorting.

FIG. 5 illustrates the rapid reduction with a thicker gate insulation film in the rate of occurrence of gate shorting due to floating static electricity of the gate insulation film of the transistor whose gate electrode provides an input terminal for this circuit at which the input signal is applied.

In the prior art, the thickness of the gate insulation film was limited to the order of 1,000 – 2,000 A in order to realize a large amplitude output voltage and fast switching speed, so that there was a relatively high probability of gate shorting, as shown in FIG. 5. Such gate shorting accidents were regarded as inevitable for this kind of integrated circuit.

According to the present invention, however, the thickness of the gate insulation film of the transistor 1 in FIG. 1 whose gate electrode provides an input terminal for the input signal for this circuit is selected to be thick, such as 4,000 A, so that as mentioned above, the gate shorting hardly occurs, as can be understood from FIG. 5. Thus, it is possible to obtain a highly reliable integrated circuit. Whereas, even if the gate insulation film of the transistor which is not directly connected to the input terminal of this circuit is selected to be thin such as 700 A – 1,000 A, no effect results from the outer floating static electricity, so that the threshold voltage is low. Therefore, it is possible to obtain a very high speed integrated circuit as seen from FIG. 4.

Figure 6:
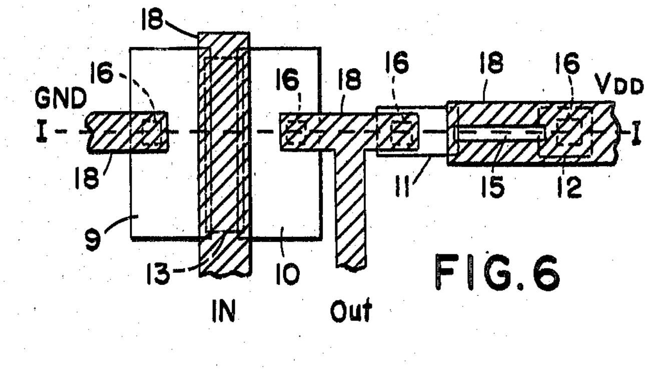
FIG. 6 is a plan view showing the pattern arrangement of the circuit of FIG. 1 constituted in an integrated circuit.
Figure 7:
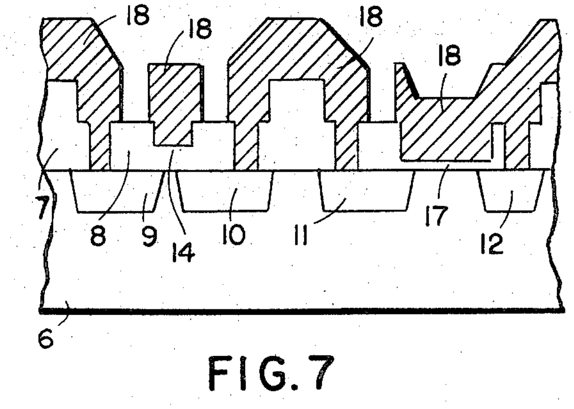
FIG. 7 is a sectional view taken along the broken line I—I of FIG. 6.

The manufacturing process of the integrated circuit having the inverter circuit shown in FIG. 1 to which this invention is applied is now described with reference to FIGS. 6 and 7.

At first, an N-type silicon wafer 6 of 5Ω, of which the surface is chemically polished, is thermally oxidized at a temperature of 1,200° C in a steamy atmosphere to form a silicon oxidization film 7 having a thickness of about 1.5 microns. At the next step, the oxidization film of those regions that correspond to the source and drain of a transistor are removed by a photoresist method, and boron is diffused into the wafer 6 from the thus-formed openings of the oxidization film at a temperature of 1,080° C. Then, an oxidization film 8 is formed by a steamy thermal oxidization at a temperature of 1,140° C and each P+ type diffusion layer for a source region 9 and a drain region 10 of the amplifying transistor 1 shown in FIG. 1, and for a source region 11 and a drain region 12 of the loading transistor 2, are respectively formed. Then, after removing the oxidization film of the gate region 13 of the amplifying transistor 1 by means of a photoresist method, a gate oxidization film 14 having a thickness of 3,000 A is formed at a temperature of 950° C by a steamy thermal oxidization method. Subsequently, the oxidization film of the gate region 15 of the loading transistor 2 and the oxidization film of the portion 16 to be connected with aluminum wiring are removed by a photoresist method and, thereafter, a gate oxidization film 17 is formed with a thickness of 1,500 A at a temperature of 950° C by a steamy thermal oxidization method. The gate oxidization film 14 which had previously been formed with a thickness of 3,000A is grown into an oxidization film having a thickness of 4,000A as a result of this oxidization. The oxidization film of a thickness of 1,500 A which has been produced on the portion 16 to be connected with the aluminum wiring, is removed again by a photoresist method and aluminum vaporization is effected on the whole surface with a thickness of about 1.3 microns. The aluminum layer is removed by means of a photoresist method, excluding electrode portion 18 of the gate and wiring regions, and the remaining aluminum portions, or electrode portion 18 of the gate and wiring regions, are alloyed at a temperature of 500° C. Through the above processes, the amplifying transistor 1 whose gate insulation film has a thickness of 4,000 A, and the loading transistor 2 whose gate insulation film has a thickness of 1,500 A, are formed in a common substrate.

The second, third and fourth embodiments of the invention will be hereinafter described; the manufacturing method of these embodiments are similar to that as above mentioned and, therefore, will not be further described herein.

Figure 8:
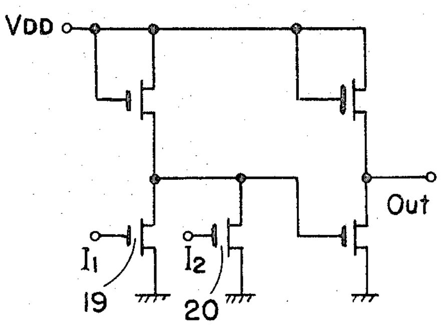
FIG. 8 is an equivalent circuit diagram of a logic circuit according to a second embodiment of the invention.
Figure 9:
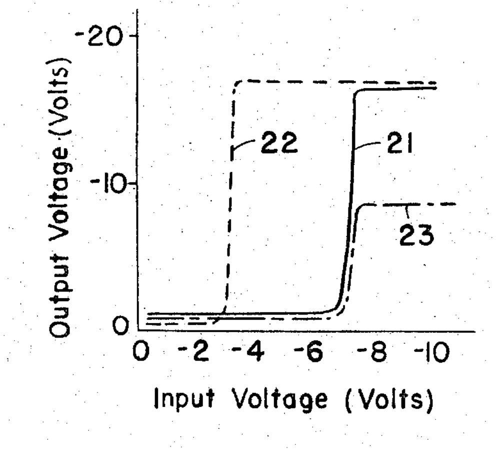
FIG. 9 is a graph showing the relationship between the input voltage and the output voltage of the circuit shown in FIG. 8.

Referring to FIG. 8, there is shown an integrated circuit as the second embodiment in which the thickness of the gate insulation films of two input amplifying transistors 19 and 20 of a two input AND logic circuit is thicker than those of the other transistors in the circuit. The input-output characteristic of this circuit is shown by a solid line 21 in FIG. 9. This circuit is also, similarly as in the embodiment of FIG. 1, characterized by a high tolerance to input noise voltage and a high amplitude of output voltage as compared with the input-output characteristics for the case in which the gate insulation films of all of the transistors are uniformly thin, which produces the input-output characteristic shown in broken line 22, and for the case in which such films are uniformly thick which produces the input-output characteristic shown by broken line 23. And this embodiment is also similar to the first embodiment in that switching speed is fast and reliability is high because of no likelihood of gate shorting.

Figure 10:
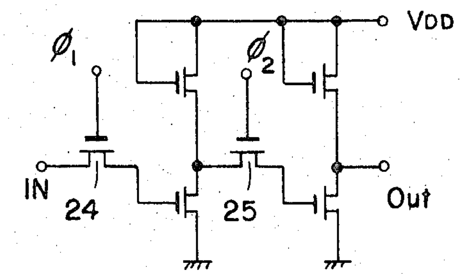
FIG. 10 is an equivalent circuit diagram of a flip-flop circuit of the delaying type according to a third embodiment of the invention.
Figure 11:
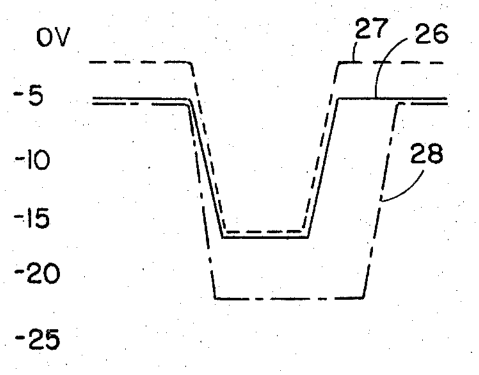
FIG. 11 is a diagram showing the wave forms of a clock input for the circuit of FIG. 10.

Referring to FIG. 10, there is shown as a third embodiment of the invention an integrated circuit of a delayed flip-flop circuit employing a two phase clock pulse system of $\phi_1$ and $\phi_2$, wherein the thickness of the gate insulation films of a transistor 24 to the gate of which transistor a clock pulse $\phi_1$ is applied, and of a transistor 25 to the gate of which transistor a clock pulse $\phi_2$ is applied, are thicker than those of other remaining transistors in the circuit. If the transistors 24 and 25 have similar constructions as that of the transistor 1 in the first embodiment of FIG. 1, and the remaining transistors are of similar construction as that of the transistor 2 in that first embodiment, a typical waveform of the clock pulses $\phi_1$ and $\phi_2$, when supply voltage $V_{DD}$ is the same as in the first embodiment, is shown by a solid line 26 in FIG. 11. The higher level $V\phi_H$ of the clock pulse is in a wider range, such as 0~−5V, than the range, such as 0~−2V, of the high level of the clock pulse having waveform 27 in the case that all transistors in the circuit have a thin gate insulation film, so that tolerance to input noise is improved. Even if the lower level $V\phi_L$ of the clock pulse is −16V, the flip-flop circuit according to this invention can operate, but in a circuit in which the gate insulation film of all transistors is thick, the lower level of the clock pulse is −22V so that the flip-flop circuit does not operate within the range of −16V to −22V of the lower level of the clock pulse. As understood from the above descriptions, in the conventional integrated circuit employing transistors having common thickness of gate insulation film, it was impossible in principle to simultaneously satisfy the conditions that the higher level $V\phi_H$ is low and lower level $V\phi_L$ is high, but in the integrated circuit according to the present invention, it is possible to satisfy these conditions easily. This embodiment is also similar to the first embodiment in that the thickness of the gate insulation film of the transistors 24 and 25 to which the input clock pulses are applied is relatively thick and thus there is no likelihood of the occurrence of gate shorting.

Figure 12:
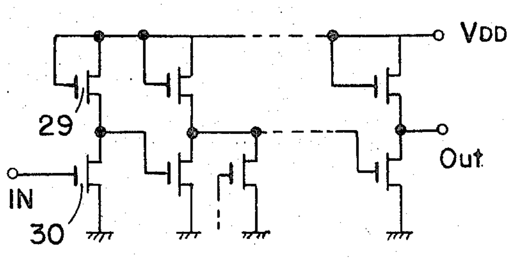
FIG. 12 is an equivalent circuit diagram of a general logic integrated circuit according to a fourth embodiment of the present invention.

Referring to FIG. 12, there is shown an integrated circuit of a logic circuit comprising a plurality of stages, as a fourth embodiment of the present invention, in which the gate insulation films of the transistors 29 and 30 of the stages directly connected to an input terminal of the logic circuit are thicker than those of the transistors of the other remaining intermediate and final output stages of the circuit. In this case, the amplitude of the output voltage of the first stage is low.

This results in no harmful effect on the operation of the logic circuit, since the gate insulation film of the second stage is thin and the threshold voltage is accordingly low. Moreover, the intermediate and output stages of the circuit all have thin gate insulation films and thus the switching speed of these stages is fast, and large amplitude of the output signal can be obtained. This embodiment is also characterized, like the first embodiment, in that its tolerance to input noise voltage is great and there is no likelihood of gate shorting.

The materials and the manufacturing method for the first embodiment and the equivalent circuit in the first through the fourth embodiments of the invention herein disclosed have been shown by way of example for explanation of this invention and are not intended to limit the invention. Namely, the integrated circuit may include not only insulation gate type field effect transistor but also circuits including bipolar type transistors, diodes, resistors and other electrical components, and such materials may be replaced by other materials so far known.

The present invention has been described above and covers all of the semiconductor integrated circuits defined in the following claims.

I claim:

1. A semiconductor integrated logic circuit having a first insulated gate type field effect transistor and a second insulated gate type field transistor formed in a common substrate, the gate terminal of said first transistor connected to an input terminal for receiving an input signal from an external circuit wherein the improvement comprises the gate insulator film means of said first transistor being thicker than that of said second transistor, said film means producing a higher threshold voltage for said first transistor than for said second transistor so that said logic circuit has an improved input-to- output characteristic including a broad tolerance to the input noise level than a semiconductor logic circuit comprising insulated gate type field effect transistors each of which has a gate insulation film of substantially the same thickness.

2. The semiconductor integrated logic circuit claimed in claim 1, in which the thickness of the gate insulation film of said first transistor is approximately 4,000 A, and the thickness of the gate insulation film of said second transistor is approximately 1,500 A.

3. The semiconductor integrated logic circuit claimed in claim 1, further comprising an output terminal coupled to the source of said second transistor and to the drain of said first transistor.

* * * * *